United States Patent
Chen et al.

(10) Patent No.: US 11,139,288 B2
(45) Date of Patent: Oct. 5, 2021

(54) SILICON-CONTROLLED-RECTIFIER ELECTROSTATIC PROTECTION STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Guang Chen, Shanghai (CN); Jie Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 21 days.

(21) Appl. No.: 16/822,456

(22) Filed: Mar. 18, 2020

(65) Prior Publication Data

US 2020/0303368 A1  Sep. 24, 2020

(30) Foreign Application Priority Data

Mar. 20, 2019 (CN) .......................... 201910213502.5

(51) Int. Cl.
*H01L 27/02* (2006.01)
*H01L 29/66* (2006.01)
*H01L 29/747* (2006.01)

(52) U.S. Cl.
CPC .... *H01L 27/0262* (2013.01); *H01L 29/66386* (2013.01); *H01L 29/747* (2013.01)

(58) Field of Classification Search
None
See application file for complete search history.

(56) References Cited

U.S. PATENT DOCUMENTS

| | | | | |
|---|---|---|---|---|
| 2010/0301418 | A1* | 12/2010 | Kim | H01L 29/87 257/360 |
| 2012/0091503 | A1* | 4/2012 | Su | H01L 29/7436 257/140 |
| 2016/0056146 | A1 | 2/2016 | Li et al. | |
| 2018/0301445 | A1* | 10/2018 | Yam | H01L 27/0262 |

* cited by examiner

*Primary Examiner* — Khaja Ahmad
(74) *Attorney, Agent, or Firm* — Anova Law Group, PLLC

(57) ABSTRACT

A silicon-controlled-rectifier electrostatic protection structure and a fabrication method are provided. The structure includes: a substrate of P-type; a first N-type well; a second N-type well; a third N-type well; an anode P-type doped region in the first N-type well; second N-type doped regions at sides of the first N-type well; first P-type doped regions at sides of the first N-type well; third N-type doped regions at sides of the first N-type well; gate structures and fourth N-type doped regions at the sides of the first N-type well; and fifth N-type doped regions at the sides of the first N-type well. The fourth N-type doped regions and the third N-type doped regions are disposed at sides of each of the gate structures along a first direction respectively.

14 Claims, 3 Drawing Sheets

SILICON-CONTROLLED-RECTIFIER ELECTROSTATIC PROTECTION STRUCTURE AND FABRICATION METHOD THEREOF

CROSS-REFERENCES TO RELATED APPLICATION

This application claims the priority of Chinese Patent Application No. 201910213502.5, filed on Mar. 20, 2019, the content of which is incorporated herein by reference in its entirety.

TECHNICAL FIELD

The present disclosure generally relates to the field of semiconductor technologies and, more particularly, relates to a silicon-controlled-rectifier electrostatic protection structure and its fabrication method.

BACKGROUND

In fabrication and application of integrated circuit chips, as very-large-scale-integrated-circuit processes are continuously improved, fabrication of complementary-metal-oxide-semiconductor (CMOS) integrated circuits enters a deep sub-micrometer stage. Size of metal-oxide-semiconductor (MOS) devices continuously decreases, and thickness of a gate oxidation layer becomes thinner. Correspondingly, a voltage withstanding capability of the MOS devices is significantly reduced. Damage on the integrated circuits induced by electrostatic discharge (ESD) becomes more serious, and ESD protection of the integrated circuits becomes more important.

To improve the protection of a chip against static electricity, an electrostatic protection circuit is usually connected to input/output pads (I/O pads) of the chip. The electrostatic protection circuit provides a discharge path of electrostatic currents in internal circuits of the chip, to avoid a breakdown of the internal circuits of the chip induced by the static electricity.

However, electrostatic protection structures formed by current technologies have poor performance. Therefore, there is a need to provide an electrostatic protection structure with improved performance and its fabrication method.

SUMMARY

One aspect of the present disclosure provides a silicon-controlled-rectifier electrostatic protection structure. The structure includes: a substrate of P-type; a first N-type well; a second N-type well; a third N-type well; an anode P-type doped region in a top part of the first N-type well; second N-type doped regions arranged along a second direction and located in the substrate at both sides of the first N-type well, and disposed between the first N-type well and the second N-type well; first P-type doped regions arranged along a second direction and located in the second N-type well at both sides of the first N-type well; third N-type doped regions arranged along a first direction and located in the second N-type well at both sides of the first N-type well; gate structures arranged along the first direction X and located on the substrate at both sides of the first N-type well and at outer sides of the second N-type well; fourth N-type doped regions arranged along the first direction and located in the substrate at both sides of the first N-type well and at outer sides of the second N-type well; and fifth N-type doped regions arranged along the second direction and located in the substrate at both sides of the first N-type well and at outer sides of the second N-type well. The first N-type well, the second N-type well, and the third N-type well may be disposed in the substrate. The second N-type well may be disposed at sides of the first N-type well to surround the first N-type well. The third N-type well may be disposed under a bottom of the first N-type well. The third N-type well may adjoin the first N-type well and a bottom of the second N-type well. The third N-type doped regions may extend into the substrate at outer sides of the second N-type well. The fourth N-type doped regions and the third N-type doped regions may be disposed at both sides of each of the gate structures respectively and arranged along the first direction.

Another aspect of the present disclosure provides a fabrication method for a silicon-controlled-rectifier electrostatic protection structure. The method includes: providing a substrate of P-type; forming a first N-type well, a second N-type well, and a third N-type well, in the substrate; forming an anode P-type doped region in a top region of the first N-type well; forming second N-type doped regions arranged along a second direction and located in the substrate in the substrate at both sides of the first N-type well, and disposed between the first N-type well and the second N-type well; forming first P-type doped regions arranged along a second direction and located in the second N-type well at both sides of the first N-type well; forming third N-type doped regions arranged along a first direction perpendicular to the second direction and located in the second N-type well at both sides of the first N-type well; forming gate structures arranged along the first direction X and located on the substrate at both sides of the first N-type well and at outer sides of the second N-type well; forming fourth N-type doped regions arranged along the first direction and located in the substrate at both sides of the first N-type well and at outer sides of the second N-type well; and forming fifth N-type doped regions arranged along the second direction and located in the substrate at both sides of the first N-type well at outer sides of the second N-type well. The second N-type well is disposed at sides of the first N-type well and surrounds the first N-type well. The second N-type well is isolated from the first N-type well. The third N-type well is disposed under a bottom of the first N-type well. The third N-type well adjoins the first N-type well and a bottom of the second N-type well. Each second N-type doped region is electrically connected to a corresponding first P-type doped region. The third N-type doped regions extend into the substrate at outer sides of the second N-type well. The fourth N-type doped regions and the third N-type doped regions are disposed at both sides of each of the gate structures respectively and arranged along the first direction.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

An SCR electrostatic protection structure has two important parameters including holding voltage and trigger voltage. The SCR electrostatic protection structures develop toward a direction with higher holding voltage and lower trigger voltage. There is a need to further increase the holding voltage and lower the trigger voltage of the SCR electrostatic protection structures. Also, an integration level of the SCR electrostatic protection structures needs to be improved.

The present disclosure provides an SCR electrostatic protection structure. The structure may include: a substrate of P-type; a first N-type well; a second N-type well; a third N-type well; an anode P-type doped region in a top part of the first N-type well; second N-type doped regions arranged along a second direction and located in the substrate at both sides of the first N-type well, and disposed between the first N-type well and the second N-type well; first P-type doped regions arranged along a second direction Y and located in the second N-type well at both sides of the first N-type well; third N-type doped regions arranged along a first direction X and located in the second N-type well at both sides of the first N-type well; gate structures arranged along the first direction X and located on the substrate at both sides of the first N-type well and at outer sides of the second N-type well; fourth N-type doped regions arranged along the first direction and located in the substrate at both sides of the first N-type well and at outer sides of the second N-type well; and fifth N-type doped regions arranged along the second direction and located in the substrate at both sides of the first N-type well and at outer sides of the second N-type well.

The first N-type well, the second N-type well, and the third N-type well may be disposed in the substrate. The second N-type well may be disposed at sides of the first N-type well to surround the first N-type well. The third N-type well may be disposed under a bottom of the first N-type well. The third N-type well may adjoin the first N-type well and a bottom of the second N-type well. The second N-type doped regions may be disposed between the first N-type well and the second N-type well. The third N-type doped regions may extend into the substrate at outer sides of the second N-type well. The fourth N-type doped regions and the third N-type doped regions may be disposed at both sides of each of the gate structures respectively and arranged along the first direction. The SCR electrostatic protection structure may have improved performance.

Figure 1:
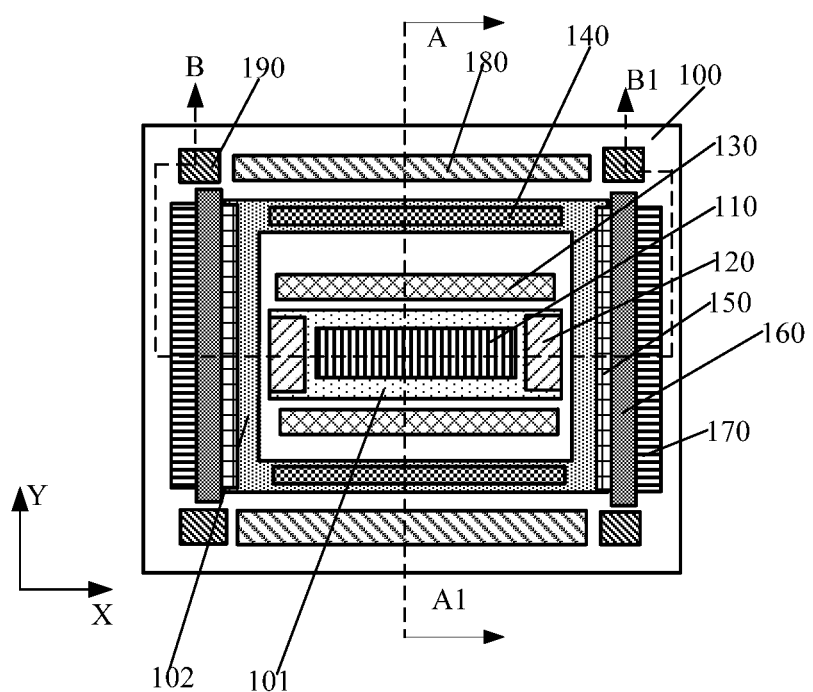
FIG. 1 illustrates a silicon-controlled-rectifier (SCR) electrostatic protection structure according to various disclosed embodiments of the present disclosure.
Figure 2:
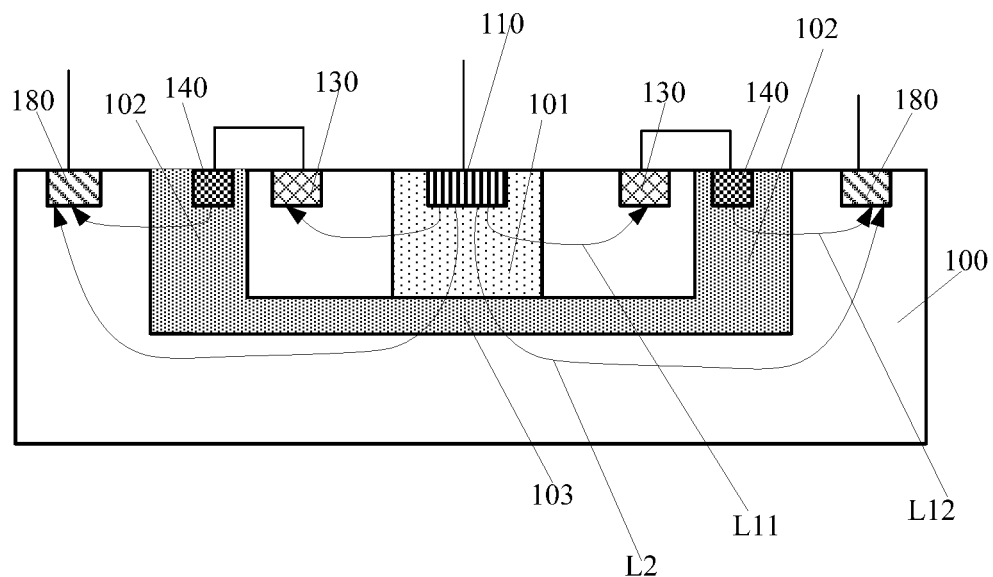
FIG. 2 illustrates a cross-section view of the SCR electrostatic protection structure in FIG. 1 along an A-A1 direction.
Figure 3:
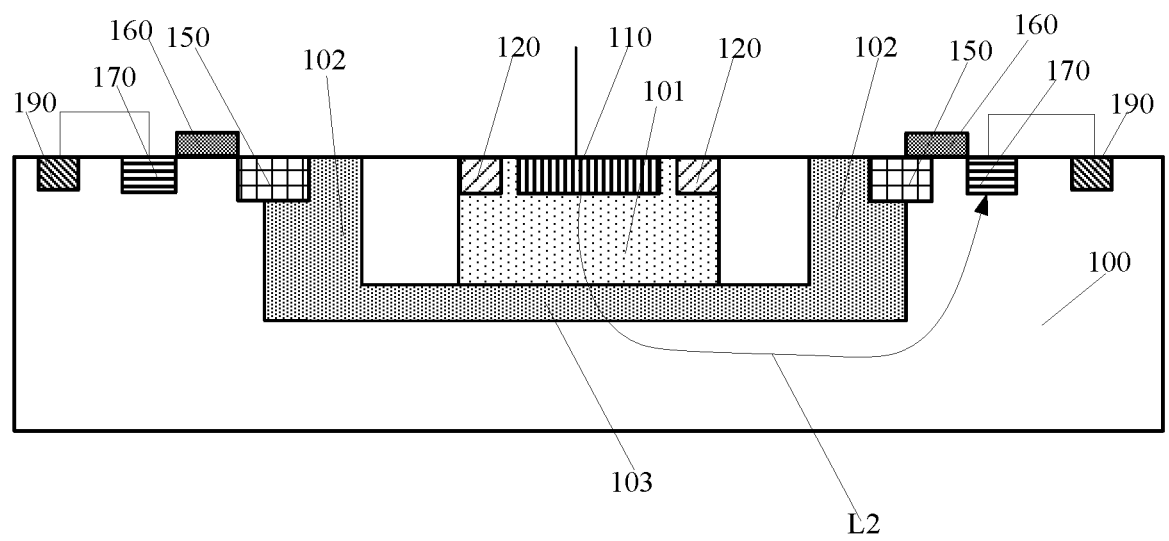
FIG. 3 illustrates a cross-section view of the SCR electrostatic protection structure in FIG. 1 along a B-B1 direction.

As illustrated in FIGS. 1-3, in one embodiment, the SCR electrostatic protection structure may include: a substrate of P-type 100; a first N-type well 101; a second N-type well 102; a third N-type well 103; an anode P-type doped region 110; second N-type doped regions 130; first P-type doped regions 140 third N-type doped regions 150; gate structures 160; fourth N-type doped regions 170; and fifth N-type doped regions 180.

The first N-type well 101, the second N-type well 102, and the third N-type well 103 may be disposed in the substrate 100. The second N-type well 102 may be disposed at the sides of the first N-type well 101 to surround the first N-type well 101. The second N-type well 102 may be separated from the first N-type well 101. The third N-type well 103 may be disposed under a bottom of the first N-type well 101. The third N-type well 103 may adjoin the first N-type well 101 and a bottom of the second N-type well 102.

The anode P-type doped region 110 may be located in a top part of the first N-type well 101.

The second N-type doped regions 130 may be arranged along a second direction Y and located in the substrate 100 at both sides of the first N-type well 101. The second N-type doped regions 130 may be disposed between the first N-type well 101 and the second N-type well 102.

The first P-type doped regions 140 may be arranged along a second direction Y and located in the second N-type well 102 at both sides of the first N-type well 101. Each of the first P-type doped regions 140 may be electrically connected to a corresponding second N-type doped region 130.

The third N-type doped regions 150 may be arranged along a first direction X and located in the second N-type well 102 at both sides of the first N-type well 101. Each of third N-type doped regions 150 may extend into the substrate 100 at outer sides of the second N-type well 102. The first direction X may be perpendicular to the second direction Y.

The gate structures 160 may be arranged along the first direction X and located on the substrate 100 at both sides of the first N-type well 101 and at outer sides of the second N-type well 102.

The fourth N-type doped regions 170 may be arranged along the first direction and located in the substrate 100 at both sides of the first N-type well 101 and at outer sides of the second N-type well 102.

Each of the fourth N-type doped regions 170 and a corresponding third N-type doped region 150 may be disposed at both side of a corresponding gate structure 160 respectively and arranged along the first direction X.

The fifth N-type doped regions 180 may be arranged along the second direction Y and located in the substrate 100 at both sides of the first N-type well 101 and at outer sides of the second N-type well 102.

For description purposes only, the embodiments where the substrate 100 is a planar semiconductor substrate will be used as examples to illustrate the present disclosure and should not limit the scopes of the present disclosure. In various embodiments, the substrate 200 may be any suitable substrate.

A conductive type of the substrate 100 may be P-type, and the substrate 100 may be made of a material including single-crystalline silicon, single-crystalline germanium, and single-crystalline SiGe.

A top surface of the substrate 100 may expose the first N-type well 101 and the second N-type well 102. A top surface of the first N-type well 101 may be flush with the top surface of the substrate 100 and a top surface of the second N-type well 102 may be flush with the top surface of the substrate 100.

The third N-type well 103 may be disposed under a bottom of the first N-type well 101. A depth of the third N-type well 103 in the substrate 100 may be larger than a depth of the first N-type well 101 in the substrate 100.

A concentration of N-type ions in the third N-type well 103 may be smaller than a concentration of N-type ions in the first N-type well 101, and also smaller than a concentration of N-type ions in the second N-type well 102. In one embodiment, the concentration of the N-type ions in the third N-type well 103 may be about a half to ¾ of the concentration of the N-type ions in the first N-type well 101.

Since the concentration of the N-type ions in the third N-type well 103 may be small, after a second electrical current discharging path is turn on subsequently, a corresponding turn-on resistance may be large. A holding voltage may be improved.

The third N-type well 103 may adjoin the first N-type well 101. The third N-type well 103 may also adjoin the bottom of the second N-type well 102. Correspondingly, the third N-type well 103 and the second N-type well 102 may form a semi-enclosed structure together. A portion of the substrate 100 above the third N-type well 103 and between the second N-type well 102 and the first N-type well 101 may be isolated from another portion of the substrate 100 under the third N-type well 103. Also, a portion of the substrate 100 at a side of the second N-type well 102 toward the first N-type well 101 may be isolated from a portion of the substrate 100 at a side of the second N-type well 102 away from the first N-type well 101.

The SCR electrostatic protection structure may further include first N-type doped regions 120 located in the first N-type well 101 at both sides of the anode P-type doped region 110 and arranged along the first direction X. The first N-type doped regions 120 may be electrically connected to the anode P-type doped region 110.

In one embodiment, a size of the first N-type doped regions 120 along the first direction X may be smaller than a size of the anode P-type doped region 110 along the first direction X. Correspondingly, an area occupied by the first N-type doped regions 120 may be small.

The SCR electrostatic protection structure may further include cathode P-type doped regions 190 in the substrate 100 at both sides of each of the fifth N-type doped regions 180 along the first direction X. The cathode P-type doped regions 190, the third N-type doped regions 150, the fourth N-type doped regions 170, and the fifth N-type doped regions 180 may be discrete from each other. Each of the cathode P-type doped regions 190 may be electrically connected to a corresponding fourth N-type doped region 170 or a corresponding fifth N-type doped region 190.

The third N-type doped regions 150 may extend into the substrate 100 at outer sides of the second N-type well 102 along the first direction X.

The cathode P-type doped regions 190, the third N-type doped regions 150, the fourth N-type doped regions 170, and the fifth N-type doped regions 180 may be discrete from each other.

The second N-type doped regions 130, the first N-type well 101, and the second N-type well 102 may be discrete from each other.

In the present disclosure, the SCR electrostatic protection structure may further include the first N-type doped regions 120 electrically connected to an anode voltage. Correspondingly, the first N-type well 101 may have a higher voltage, and conduction of a first PNP transistor in the SCR electrostatic protection structure under a normal operating voltage may be avoided. The reliability of the SCR electrostatic protection structure may be improved.

In the present disclosure, the SCR electrostatic protection structure may further include the cathode P-type doped regions 190 electrically connected to a ground line. The reliability of the SCR electrostatic protection structure may be further improved.

The SCR electrostatic protection structure may further include first connecting lines (not shown in the figures). The first connecting lines may electrically connect the first N-type doped regions 120 to the anode P-type doped region 110.

The first connecting lines may be made of metal.

The fourth N-type doped regions 170 may be separated from the third N-type doped regions 150. Each of the third N-type doped regions 150 may be used as a drain at a side of a corresponding gate structure 160. Each of the fourth N-type doped regions 170 may be used as a source at a side of a corresponding gate structure 160. A gate structure 160, a corresponding third N-type doped region 150, and a corresponding fourth N-type doped region 170 may form an NMOS transistor.

In one embodiment, each gate structure 160 may cover a portion of a corresponding third N-type doped region 150 in the substrate 100 at an outer side of the second N-type well 102, so that the area of the structure may be reduced.

In other embodiments, each of the fourth N-type doped regions 170 and a corresponding third N-type doped region 150 may be disposed at both sides of a corresponding gate structure 160 respectively, and the gate structures 160 may not cover the third N-type doped regions 150.

An outer side of the second N-type well 102 may be a side of the second N-type well away from the first N-type well 101. An inner side of the second N-type well 102 may be a side of the second N-type well toward the first N-type well 101.

In one embodiment, a size of the cathode P-type doped regions 190 along the first direction X may be smaller than a size of the fifth N-type doped regions 180 along the first direction. A size of the cathode P-type doped regions 190 along the second direction Y may be smaller than a size of third N-type doped regions 150 along the second direction Y and smaller than a size of the fourth N-type doped regions 170 along the second direction Y.

The first P-type doped regions 140 may be electrically connected to the second N-type doped regions 130. In detail, a first P-type doped region 140 at a first side of the first N-type well 101 along the second direction Y may be electrically connected to a corresponding second N-type doped region 130 at the first side of the first N-type well 101 along the second direction Y, and another first P-type doped region 140 at second side of the first N-type well 101 along the second direction Y may be electrically connected to another corresponding second N-type doped region 130 at the second side of the first N-type well 101 along the second direction Y.

The SCR electrostatic protection structure may further include second connecting lines electrically connecting the fourth N-type doped regions 170 and the cathode P-type doped regions 190.

The SCR electrostatic protection structure may further include third connecting lines electrically connecting the fifth N-type doped regions 180 and the cathode P-type doped regions 190.

The second connecting lines and the third connecting lines may be made of metals.

The cathode P-type doped regions 190 may be disposed in the substrate 100 at both sides of each of the fifth N-type doped regions 180 along the first direction X, and at both sides of each of the fourth N-type doped regions 170 along the second direction Y. That is, the substrate 100 may include corner regions surrounded by the fifth N-type doped regions 180 and the fourth N-type doped regions 170, and the cathode P-type doped regions 190 may be disposed in the corner regions.

The SCR electrostatic protection structure may include a first current discharge structure and second current discharge structures T3. The first current discharge structure may include a first sub discharge structure T1 and a second sub discharge structure T2.

Figure 4:
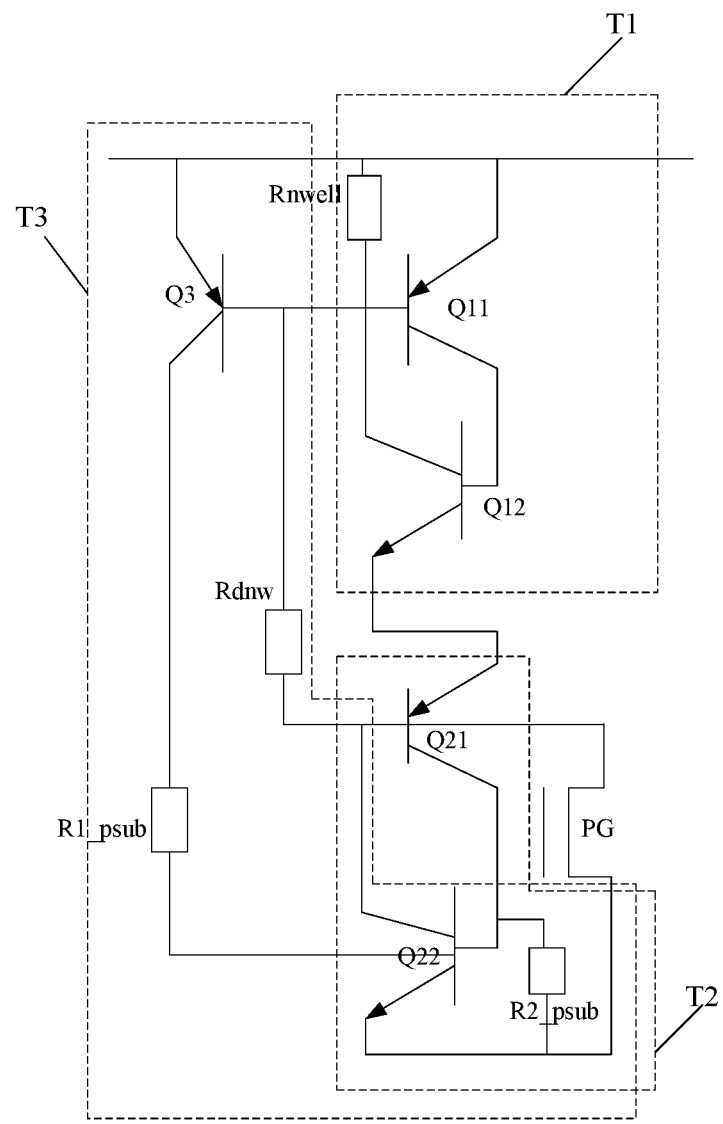
FIG. 4 illustrates an equivalent circuit diagram corresponding to the SCR electrostatic protection structure in FIG. 1.

The first sub discharge structure T1 may be a PNPN structure, and as illustrated in FIG. 4, may include a first PNP transistor Q11 and a first PNP transistor Q12. The anode P-type doped region 110 may be used as an emission electrode of the first PNP transistor Q11, the first N-type well 101 may be used as a base electrode of the first PNP transistor Q11, and a first portion of the substrate 100 surrounded by the first N-type well 101, the second N-type well 102, and the third N-type well 103 may be used as a collection electrode of the first PNP transistor Q11. For the first NPN transistor Q12, the first N-type well 101 may be used as a collection electrode, the first portion of the substrate 100 surrounded by the first N-type well 101, the second N-type well 102, and the third N-type well 103 may be used as a base electrode, and the second N-type doped regions 130 may be used as an emission electrode. The first PNP transistor Q11 and the first NPN transistor may be connected as illustrated in FIG. 4.

The second sub discharge structure T2 may have a PNPN structure as illustrated in FIG. 4, and may include a second PNP transistor Q21 and a second NPN transistor Q22. For the second PNP transistor Q21, the first P-type doped regions 140 may be used as an emission electrode, the second N-type well 102 may be used as a base electrode, and a first portion of the substrate 100 outside the second N-type well 102 may be used as a collection electrode. For the second NPN transistor Q22, the second N-type well 102 may be used as a collection electrode, the first portion of the substrate 100 outside the second N-type well 102 may be used as a base electrode, and the fifth N-type doped regions 180 may be used as an emission electrode. The second PNP transistor Q21 and the second NPN transistor Q22 may be connected as illustrated in FIG. 4.

The second current discharge structures T3 may have a PNPN structure, and may include a third PNP transistor Q3 and a third NPN transistor. For the third PNP transistor Q3, the first P-type doped regions 140 may be used as an emission electrode, the first N-type well 101 and the third N-type well 103 may be used together as a base electrode, and a second portion of the substrate 100 at the bottom of the third N-type well 103 may be used as a collection electrode.

As illustrated in FIG. 2 showing a cross-section along the second direction Y, for the third NPN transistor of the second current discharge structure T3, arranged along the second direction Y, the first portion of the substrate 100 outside the second N-type well 102 may be used as a base electrode, the fifth N-type doped regions 180 may be used as an emission electrode, and the second N-type well 102 may be used as a collection electrode. Correspondingly, the third NPN transistor and the second NPN transistor Q22 may use a common base electrode, a common collection electrode, and a common emission electrode. The second current discharge structure T3 illustrated in FIG. 4 may correspond to the second current discharge structure illustrated in FIG. 2.

As illustrated in FIG. 3 showing a cross-section along the first direction X, for the third NPN transistor of the second current discharge structure T3, arranged along the first direction X, the first portion of the substrate 100 outside the second N-type well 102 may be used as a base electrode, the fourth N-type doped regions 170 may be used as an emission electrode, and the second N-type well 102 may be used as a collection electrode.

The SCR electrostatic protection structure may have two types of current discharge paths, namely a first current discharge path L1 and a second current discharge path L2. The first current discharge path L1 may include a first sub current discharge path L11 and a second sub current discharge path L12. The first sub current discharge path L11 may correspond to the first sub discharge structure T1, the second sub current discharge path L12 may correspond to the second sub discharge structure T2, and the second current discharge path L2 may correspond to the second current discharge structures T3.

In a trigger mode of the SCR electrostatic protection structure provided by the present disclosure, a trigger voltage may be applied between the cathode and the anode. The NMOS transistor may be turned on to pull down a base voltage of the first PNP transistor Q11 and a base voltage of the second PNP transistor Q21. The first PNP transistor Q11 and the second PNP transistor Q21 may be turned on correspondingly. Turning on the first PNP transistor Q11 may pull up a base voltage of the first NPN transistor Q12 to turn on the first NPN transistor Q12. Turning on the second PNP transistor Q21 may pull up a base voltage of the second NPN transistor Q22 to turn on the second NPN transistor Q22. The first current discharge path may be triggered to discharge current correspondingly. Turning on the NMOS transistor may also pull down a base voltage of the third PNP transistor Q3. The third PNP transistor Q3 then may be turned on to pull up a base voltage of the third NPN transistor. Correspondingly, the third NPN transistor may be turned on to trigger the second current discharge path to discharge current. A lower trigger voltage may be needed to trigger the first and the second current discharge path to discharge current. The trigger voltage of the SCR electrostatic protection structure may be reduced.

In the present disclosure, the third N-type well 103 in the second current discharge structure T3 may have a large depth, and a conducting resistance of the second current discharge path when the second current discharge path is conducting may be increased. The hold voltage of the SCR electrostatic protection structure may be increased. The first current discharge path may include the first sub current discharge path and the second sub current discharge path. The first current discharge path may be formed by serially connecting the first sub current discharge path and the second sub current discharge path. The hold voltage of the SCR electrostatic protection structure may be increased further. Correspondingly, for a semiconductor device protected by the SCR electrostatic protection structure, a voltage range for normal operation of the semiconductor device may be enlarged.

In the present disclosure, a size of the first N-type doped regions 120 along the first direction X may be smaller than a size of the anode P-type doped region 110 along the first direction X. The first N-type doped regions 120 may occupy a smaller area. The cathode P-type doped regions 190 may be disposed in the corner regions of the substrate 100, and may occupy a small area. The first P-type doped regions 140 may be disposed in the second N-type well 102 at both sides of the first N-type well 101 and arranged along the second direction Y, and may occupy a portion of the region of the second N-type well 102. Correspondingly, an extra area for forming the first P-type doped regions 140 may be avoided. An area occupied by the SCR electrostatic protection structure may be reduced and a discharged current in a unit area may be increased. A level of the SCR electrostatic protection structure may be improved.

In the present disclosure, the first N-type doped regions 120 and the cathode P-type doped regions 190 may occupy a small area, and an extra area for forming the first P-type doped regions 140 may be avoided. Correspondingly, the area occupied by the SCR electrostatic protection structure may be reduced. When the NMOS transistor is turned on, the first sub discharge structure T1 and the second sub discharge structure T2 may be triggered to discharge current simultaneously. The SCR electrostatic protection structure may have a simple trigger structure, and there may be no needs to provide different trigger parts for the first sub discharge structure T1 and the second sub discharge structure T2. Correspondingly, the area occupied by the SCR electrostatic protection structure may be reduced further.

In FIG. 4, R well may be an equivalent resistance of the first N-type well 101, Rdnw may be a total equivalent resistance of the first N-type well 101 and the third N-type well 103, R1_psub may be an equivalent resistance of a portion of the substrate 100 at the bottom of the third N-type well, and R2_psub may be an equivalent resistance of another portion of the substrate 100 outside the second N-type well 102.

The present disclosure also provides a fabrication method for forming the SCR electrostatic protection structure provided by the above embodiments. The fabrication method may include: providing a substrate of P-type 100; forming a first N-type well 101, a second N-type well 102, and a third N-type well 103 in the substrate 100; forming an anode P-type doped region 110 in a top part of the first N-type well; forming second N-type doped regions 130 arranged along a second direction and located in the substrate 100 at both sides of the first N-type well 101; forming first P-type doped regions 140 arranged along a second direction Y and located in the second N-type well 102 at both sides of the first N-type well 101; forming third N-type doped regions 150 arranged along a first direction X and located in the second N-type well 102 at both sides of the first N-type well 101; forming gate structures 160 arranged along the first direction X and located on the substrate 100 at both sides of the first N-type well 101 and at outer sides of the second N-type well 102; forming fourth N-type doped regions 170 located in the substrate 100 at both sides of the first N-type well 101 and arranged along the first direction and at outer sides of the second N-type well 102; and forming fifth N-type doped regions 180 arranged along the second direction and located in the substrate 100 at the sides of the first N-type well 101 and at outer sides of the second N-type well 102.

The first N-type well 101, the second N-type well 102, and the third N-type well 103 may be disposed in the substrate 100. The second N-type well 102 may be disposed at the sides of the first N-type well 101 to surround the first N-type well 101. The second N-type well 102 may be separated from the first N-type well 101. The third N-type well 103 may be disposed under a bottom of the first N-type well 101. The third N-type well 103 may adjoin the first N-type well 101 and a bottom of the second N-type well 102. The second N-type doped regions 130 may be disposed between the first N-type well 101 and the second N-type well 102. Each of the first P-type doped regions 140 may be electrically connected to a corresponding second N-type doped region 130. The third N-type doped regions 150 may extend into the substrate 100 at outer sides of the second N-type well 102. The first direction X may be perpendicular to the second direction Y. Each of the fourth N-type doped regions 170 and a corresponding third N-type doped region 150 may be disposed at both side of a corresponding gate structure 160 respectively and arranged along the first direction X.

In one embodiment, the method may further include: forming first N-type doped regions 120 located in the first N-type well 101 at both sides of the anode P-type doped region 110 and arranged along the first direction X. The first N-type doped regions 120 may be electrically connected to the anode P-type doped region 110.

In one embodiment, the method may further include forming cathode P-type doped regions 190 in the substrate 100 at both sides of each of the fifth N-type doped regions 180 along the first direction X. The cathode P-type doped regions 190, the third N-type doped regions 150, the fourth N-type doped regions 170, and the fifth N-type doped regions 180 may be discrete from each other. Each of the cathode P-type doped regions 190 may be electrically connected to a corresponding fourth N-type doped region 170 or a corresponding fifth N-type doped region 190.

The present disclosure also provides another SCR electrostatic protection structure. The substrate in the SCR electrostatic protection structure may include a semiconductor substrate and a plurality of fins on the semiconductor substrate. The plurality of fins may extend along the first direction. The gate structures may cross a portion of the plurality of fins.

In this embodiment, the first current discharge path may penetrate the plurality of fins, and the second current discharge path may penetrate the plurality of fins. The discharged current may flow from a sidewall of a fin of the plurality of fins along a width direction to another sidewall of the fin along the width direction, by penetrating the fin. The discharge current may be increased, and the level of the SCR electrostatic protection structure may be improved.

The present disclosure also provides another fabrication method for forming above SCR electrostatic protection structures. The detail can be referred to the above discussions.

In the present disclosure, the SCR electrostatic protection structure may include the first current discharge structure and the second current discharge structures T3. The first current discharge structure may include the first sub discharge structure T1 and the second sub discharge structure T2. The first sub discharge structure T1 may be a PNPN structure, and may include the first PNP transistor Q11 and the first PNP transistor Q12. The anode P-type doped region 110 may be used as an emission electrode of the first PNP transistor Q11, the first N-type well 101 may be used as a base electrode of the first PNP transistor Q11, and a first portion of the substrate 100 surrounded by the first N-type well 101, the second N-type well 102, and the third N-type well 103 may be used as a collection electrode of the first PNP transistor Q11. For the first NPN transistor Q12, the first N-type well 101 may be used as a collection electrode, the first portion of the substrate 100 surrounded by the first N-type well 101, the second N-type well 102, and the third N-type well 103 may be used as a base electrode, and the second N-type doped regions 130 may be used as an emission electrode. The second sub discharge structure T2 may have a PNPN structure, and may include the second PNP transistor Q21 and the second NPN transistor Q22. For the second PNP transistor Q21, the first P-type doped regions 140 may be used as an emission electrode, the second N-type well 102 may be used as a base electrode, and a first portion of the substrate 100 outside the second N-type well 102 may be used as a collection electrode. For the second NPN transistor Q22, the second N-type well 102 may be used as a collection electrode, the first portion of the substrate 100 outside the second N-type well 102 may be used as a base electrode, and the fifth N-type doped regions 180 may be used as an emission electrode. The second current discharge structures T3 may have a PNPN structure, and may include the third PNP transistor Q3 and the third NPN transistor. For the third PNP transistor Q3, the first P-type doped regions 140 may be used as an emission electrode, the first N-type well 101 and the third N-type well 103 may be used together as a base electrode, and a second portion of the substrate 100 at the bottom of the third N-type well 103 may be used as a collection electrode. Correspondingly, the SCR electrostatic protection structure may have two types of current discharge paths, including the first current discharge path L1 and the second current discharge path L2. The first current discharge path L1 may include the first sub current discharge path L11 and the second sub current discharge path L12. The first sub current discharge path L11 may correspond to the first sub discharge structure T1, the second sub current discharge path L12 may correspond to the second sub discharge structure T2, and the second current discharge path L2 may correspond to the second current discharge structures T3. When applying a trigger voltage between the cathode and the anode, the NMOS transistor may be turned on to pull down a base voltage of the first PNP transistor Q11 and a base voltage of the second PNP transistor Q21. The first PNP transistor Q11 and the second PNP transistor Q21 may be turned on correspondingly. Turning on the first PNP transistor Q11 may pull up a base voltage of the first NPN transistor Q12 to turn on the first NPN transistor Q12. Turning on the second PNP transistor Q21 may pull up a base voltage of the second NPN transistor Q22 to turn on the second NPN transistor Q22. The first current discharge path may be triggered to discharge current correspondingly. Turning on the NMOS transistor may also pull down a base voltage of the third PNP transistor Q3. The third PNP transistor Q3 then may be turned on to pull up a base voltage of the third NPN transistor. Correspondingly, the third NPN transistor may be turned on to trigger the second current discharge path to discharge current. A lower trigger voltage may be needed to trigger the first and the second current discharge path to discharge current. The trigger voltage of the SCR electrostatic protection structure may be reduced.

In the present disclosure, the third N-type well 103 in the second current discharge structure T3 may have a large depth, and a conducting resistance of the second current discharge path when the second current discharge path is conducting may be increased. The hold voltage of the SCR electrostatic protection structure may be increased. The first current discharge path may include the first sub current discharge path and the second sub current discharge path. The first current discharge path may be formed by serially connecting the first sub current discharge path and the second sub current discharge path. The hold voltage of the SCR electrostatic protection structure may be increased further. Correspondingly, for a semiconductor device protected by the SCR electrostatic protection structure, a voltage range for normal operation of the semiconductor device may be enlarged.

In the present disclosure, the first P-type doped regions 140 may be disposed in the second N-type well 102 at both sides of the first N-type well 101 and arranged along the second direction Y, and may occupy a portion of the region of the second N-type well 102. Correspondingly, an extra area for forming the first P-type doped regions 140 may be avoided. An area occupied by the SCR electrostatic protection structure may be reduced and a discharged current in a unit area may be increased. When the NMOS transistor is turned on, the first sub discharge structure T1 and the second sub discharge structure T2 may be triggered to discharge current simultaneously. The SCR electrostatic protection structure may have a simple trigger structure, and there may be no needs to provide different trigger structure parts for the first sub discharge structure T1 and the second sub discharge structure T2. Correspondingly, the area occupied by the SCR electrostatic protection structure may be reduced further.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A silicon-controlled-rectifier electrostatic protection structure, comprising:
   a substrate of P-type;
   a first N-type well, a second N-type well, and a third N-type well, in the substrate, wherein: the second N-type well is disposed at sides of the first N-type well and surrounds the first N-type well; the second N-type well is isolated from the first N-type well; the third N-type well is disposed under a bottom of the first N-type well; the third N-type well adjoins the first N-type well and a bottom of the second N-type well;
   an anode P-type doped region in a top part of the first N-type well;
   second N-type doped regions arranged along a second direction and located in the substrate at both sides of the first N-type well, and disposed between the first N-type well and the second N-type well, wherein each second N-type doped region is electrically connected to a corresponding first P-type doped region;
   the first P-type doped region arranged along the second direction and located in the second N-type well at both sides of the first N-type well;
   third N-type doped regions arranged along a first direction perpendicular to the second direction and located in the second N-type well at both sides of the first N-type well, wherein the third N-type doped regions extend into the substrate at outer sides of the second N-type well;
   gate structures arranged along the first direction and located on the substrate at both sides of the first N-type well, wherein the gate structures are disposed at the outer sides of the second N-type well;
   fourth N-type doped regions arranged along the first direction and located in the substrate at both sides of the first N-type well and at the outer sides of the second N-type well, wherein the fourth N-type doped regions and the third N-type doped regions are disposed at both sides of each of the gate structures respectively and arranged along the first direction; and
   fifth N-type doped regions arranged along the second direction and located in the substrate at both sides of the first N-type well and at the outer sides of the second N-type well.

2. The structure according to claim 1, wherein:
   a concentration of N-type ions in the third N-type well is smaller than a concentration of N-type ions in the first N-type well and is smaller than a concentration of N-type ions in the second N-type well.

3. The structure according to claim 2, wherein:
the concentration of the N-type ions in the third N-type well is about ½ to about ¾ of the concentration of the N-type ions in the first N-type well.

4. The structure according to claim 1, further including first N-type doped regions located in the first N-type well at both sides of the anode P-type doped region and arranged along the first direction, wherein:
the first N-type doped regions are electrically connected to the anode P-type doped region.

5. The structure according to claim 4, wherein:
a size of the first N-type doped region along the first direction is smaller than a size of the anode P-type doped region along the first direction.

6. The structure according to claim 4, further including first connecting lines electrically connecting the first N-type doped regions to the anode P-type doped region.

7. The structure according to claim 1, further including cathode P-type doped regions in the substrate at both sides of the fifth N-type doped regions along the first direction, wherein:
the cathode P-type doped regions are separated from the third N-type doped regions, the fourth N-type doped regions, and the fifth N-type doped regions; and
each of the cathode P-type doped regions is electrically connected to a corresponding fourth N type-doped region or a corresponding fifth N-type doped region.

8. The structure according to claim 7, wherein:
a size of the cathode P-type doped regions along the first direction is smaller than a size of the fifth N-type doped regions along the first direction; and
a size of the cathode P-type doped regions along the second direction is smaller than a size of the third N-type doped regions along the second direction, and is smaller than a size of the fourth N-type doped regions along the second direction.

9. The structure according to claim 7, further including second connecting lines, wherein:
each of the second connecting lines electrically connects a fourth N-type doped region to a corresponding cathode P-type doped region.

10. The structure according to claim 7, further including third connecting lines, wherein:
each of the third connecting lines electrically connects a fifth N-type doped region to a corresponding cathode P-type doped region.

11. The structure according to claim 1, wherein:
the substrate includes a semiconductor substrate and a plurality of fins on the semiconductor substrate, wherein the plurality of fins extends along the first direction.

12. A fabrication method for forming a silicon-controlled-rectifier electrostatic protection structure, including:
providing a substrate of P-type;
forming a first N-type well, a second N-type well, and a third N-type well, in the substrate, wherein: the second N-type well is disposed at sides of the first N-type well and surrounds the first N-type well; the second N-type well is isolated from the first N-type well; the third N-type well is disposed under a bottom of the first N-type well; the third N-type well adjoins the first N-type well and a bottom of the second N-type well; an anode P-type doped region in a top part of the first N-type well;
forming an anode P-type doped region in a top part of the first N-type well;
forming second N-type doped regions arranged along a second direction and located in the substrate at both sides of the first N-type well, and disposed between the first N-type well and the second N-type well, wherein each second N-type doped region is electrically connected to a corresponding first P-type doped region;
forming the first P-type doped region arranged along the second direction and located in the second N-type well at both sides of the first N-type well;
forming third N-type doped regions arranged along a first direction perpendicular to the second direction and located in the second N-type well at both sides of the first N-type well, wherein the third N-type doped regions extend into the substrate at outer sides of the second N-type well;
forming gate structures arranged along the first direction X and located on the substrate at both sides of the first N-type well, wherein the gate structures are disposed at the outer sides of the second N-type well;
forming fourth N-type doped regions arranged along the first direction and located in the substrate at both sides of the first N-type well and at the outer sides of the second N-type well, wherein the fourth N-type doped regions and the third N-type doped regions are disposed at both sides of each of the gate structures respectively and arranged along the first direction; and
forming fifth N-type doped regions arranged along the second direction and located in the substrate at both sides of the first N-type well and at the outer sides of the second N-type well.

13. The structure according to claim 12, further including:
forming first N-type doped regions located in the first N-type well at both sides of the anode P-type doped region and arranged along the first direction, wherein:
the first N-type doped regions are electrically connected to the anode P-type doped region.

14. The structure according to claim 12, further including:
forming cathode P-type doped regions in the substrate at both sides of the fifth N-type doped regions along the first direction, wherein:
the cathode P-type doped regions are separated from the third N-type doped regions, the fourth N-type doped regions, and the fifth N-type doped regions; and
each of the cathode P-type doped regions is electrically connected to a corresponding fourth N type-doped region or a corresponding fifth N-type doped region.

* * * * *